(12) United States Patent
Kim et al.

(10) Patent No.: US 8,952,755 B2
(45) Date of Patent: Feb. 10, 2015

(54) POWER AMPLIFIER

(71) Applicant: Samsung Electro-Mechanics Co., Ltd., Gyeonggi-do (KR)

(72) Inventors: Yoo Hwan Kim, Gyeonggi-do (KR); Yoo Sam Na, Seoul (KR); Hyeon Seok Hwang, Seoul (KR); Byeong Hak Jo, Gyeonggi-do (KR); Hyun Hwan Yoo, Gyeonggi-do (KR)

(73) Assignee: Samsung Electro-Mechanics Co., Ltd., Gyeonggi-do (KR)

( * ) Notice: Subject to any disclaimer, the term of this patent is extended or adjusted under 35 U.S.C. 154(b) by 97 days.

(21) Appl. No.: 13/705,090

(22) Filed: Dec. 4, 2012

(65) Prior Publication Data

US 2013/0141167 A1 Jun. 6, 2013

(30) Foreign Application Priority Data

Dec. 5, 2011 (KR) .................. 10-2011-0129134

(51) Int. Cl.
*H03G 3/20* (2006.01)
*H03F 3/21* (2006.01)
*H03F 1/52* (2006.01)

(52) U.S. Cl.
CPC .. *H03F 3/21* (2013.01); *H03F 1/52* (2013.01); *H03F 3/211* (2013.01); *H03F 2200/435* (2013.01); *H03F 2200/541* (2013.01)
USPC .......................................... 330/195; 330/140

(58) Field of Classification Search
USPC .......................................... 330/133, 140, 195
See application file for complete search history.

(56) References Cited

U.S. PATENT DOCUMENTS

| | | | | |
|---|---|---|---|---|
| 3,078,420 | A * | 2/1963 | Bussard | 330/285 |
| 3,523,260 | A * | 8/1970 | Gunshinan et al. | 333/26 |
| 4,360,787 | A * | 11/1982 | Galpin | 330/284 |
| 4,859,967 | A | 8/1989 | Swanson | |
| 7,358,807 | B2 * | 4/2008 | Scuderi et al. | 330/140 |
| 7,486,137 | B2 * | 2/2009 | Magoon et al. | 330/140 |
| 2006/0057980 | A1 | 3/2006 | Haque et al. | |

OTHER PUBLICATIONS

Aoki, Ichiro et al., "Fully Integrated CMOS Power Amplifier Design Using the Distributed Active-Transformer Architecture," IEEE Journal of Solid-State Circuits, vol. 37, No. 3, Mar. 2002, pp. 371-383.

* cited by examiner

*Primary Examiner* — Steven J Mottola
(74) *Attorney, Agent, or Firm* — Bracewell & Giuliani LLP; Brad Chin

(57) ABSTRACT

Disclosed herein is a circuit for preventing an element from being damaged although output impedance of a final transistor is changed in a power amplifier. The power amplifier includes: a power stage amplifying a signal; a transformer connected to an output terminal of the power stage and coupling a signal output from the power stage; and a controller controlling a bias voltage from the power stage according to the coupled signal. Although output impedance is changed, damage to the power amplifier can be prevented. Also, the power amplifier can be automatically controlled to maintain performance thereof by sensing an operational state in which output impedance is normal.

15 Claims, 4 Drawing Sheets

| Vup | Vdn | Vpm | Vstop | Bias Voltage |
|-----|-----|-----|-------|--------------|
| 0 | 0 | 0 | 1 | maintain |
| 0 | 1 | 0 | 0 | increase |
| 1 | 0 | 1 | 0 | decrease |
| 1 | 1 | 0 | 1 | maintain |

POWER AMPLIFIER

CROSS REFERENCE(S) TO RELATED APPLICATIONS

This application claims the benefit under 35 U.S.C. Section 119 of Korean Patent Application Serial No. 10-2011-0129134, entitled "Power Amplifier" filed on Dec. 5, 2011, which is hereby incorporated by reference in its entirety into this application.

BACKGROUND OF THE INVENTION

1. Technical Field

The present invention relates to a power amplifier and, more particularly, to a circuit for preventing an element from being damaged although output impedance of a final transistor is changed in a power amplifier.

2. Description of the Related Art

In a power amplifier, damage to an output terminal element may be attributed to stability of a circuit, but, in most cases, it is ascribed to an electrical load due to a change in an output terminal end load.

Thus, a power amplifier requires a technique for protecting an output end element, and in a related art, a technique of sensing a current by using a replica circuit and protecting a circuit in the occurrence of an overcurrent in an output end according to the sensing result has been used. However, this technique disadvantageously has a low level of accuracy, a complicated circuit, and degraded efficiency.

Also, in another related art, in order to protect an output terminal element of the power amplifier, a voltage of an output terminal is sensed and a circuit is protected in the occurrence of an overvoltage in the output terminal according to the sensing result. However, in this technique, a change in impedance in the output terminal may degrade performance in a normal operation.

The present invention relates to a circuit for preventing damage to an element although output impedance of a final transistor in a power amplifier is changed, relates more particularly, to a circuit for controlling a bias voltage provided according to signal strength and an operational state by coupling a signal between a final output terminal of a transistor and a transformer, namely, a primary signal of the transformer.

SUMMARY OF THE INVENTION

An object of the present invention is to prevent damage to a transistor although output impedance is changed.

Also, another object of the present invention is to automatically perform a control to maintain performance by sensing an operational state in which output impedance is normal.

According to an exemplary embodiment of the present invention, there is provided a power amplifier including: a power stage amplifying a signal; a transformer connected to an output terminal of the power stage and coupling a signal output from the power stage; and a controller controlling a bias voltage from the power stage according to the coupled signal.

The transformer may include: an input terminal connected to an output terminal of the power stage; and an output terminal induction-coupled to the input terminal and providing an entire output.

The power stage may be operated by a bias voltage input from the controller.

A plurality of power stages may be provided.

Characteristics of operation of the plurality of power stages may be determined by efficiency of respective power stages.

The controller may provide a bias voltage to each of the plurality of power stages.

The power amplifier may further include: an input matching unit matching a signal input to the power amplifier, to the power amplifier; a drive amplifier connected to the input matching unit and operated by a bias voltage input from the controller; and an inter stage matching the power stage and the drive amplifier.

The input matching unit may be a balanced-to-unbalanced (Balun) transformer.

The power stage and the drive amplifier may be a complementary metal-oxide semiconductor (CMOS) or a bipolar junction transistor (BJT).

The power amplifier may further include: a peak detector receiving a coupled signal from an input terminal of the transformer and detecting strength of the coupled signal; a comparator connected to the peak detector and comparing a normal state signal and an abnormal state signal; and a state machine connected to the comparator and generating state signals in response to signals output from the comparator.

The peak detector may include a rectifier rectifying the coupled signal from an AC voltage to a DC voltage.

According to another exemplary embodiment of the present invention, there is provided a power amplifier including: a signal input unit; a power stage amplifying a signal output from the signal input unit; a transformer coupling a signal output from the power stage; a feedback unit feeding back the coupled signal; and a controller controlling a bias voltage of the power stage according to the coupled signal.

A plurality of power stages may be provided.

The controller may provide a bias voltage to each of the plurality of power stages.

The signal input unit may include: an input matching unit matching a signal input to the power amplifier, to the power amplifier; a drive amplifier connected to the input matching unit and operated by a bias voltage input from the controller; and an inter stage matching the power stage and the drive amplifier.

The feedback unit may include: a peak detector receiving a coupled signal from an input terminal of the transformer and detecting strength of the coupled signal; a comparator connected to the peak detector and comparing a normal state signal and an abnormal state signal; and a state machine connected to the comparator and generating state signals in response to signals output from the comparator.

DESCRIPTION OF THE PREFERRED EMBODIMENTS

Hereinafter, exemplary embodiments of the present invention will be described with reference to the accompanying drawings. However, the exemplary embodiments are described by way of examples only and the present invention is not limited thereto.

In describing the present invention, when a detailed description of well-known technology relating to the present invention may unnecessarily make unclear the spirit of the present invention, a detailed description thereof will be omitted. Further, the following terminologies are defined in consideration of the functions in the present invention and may be construed in different ways by the intention of users and operators. Therefore, the definitions thereof should be construed based on the contents throughout the specification.

As a result, the spirit of the present invention is determined by the claims and the following exemplary embodiments may be provided to efficiently describe the spirit of the present invention to those skilled in the art.

Hereinafter, embodiments of the present invention will be described with reference to the accompanying drawings.

Figure 1:
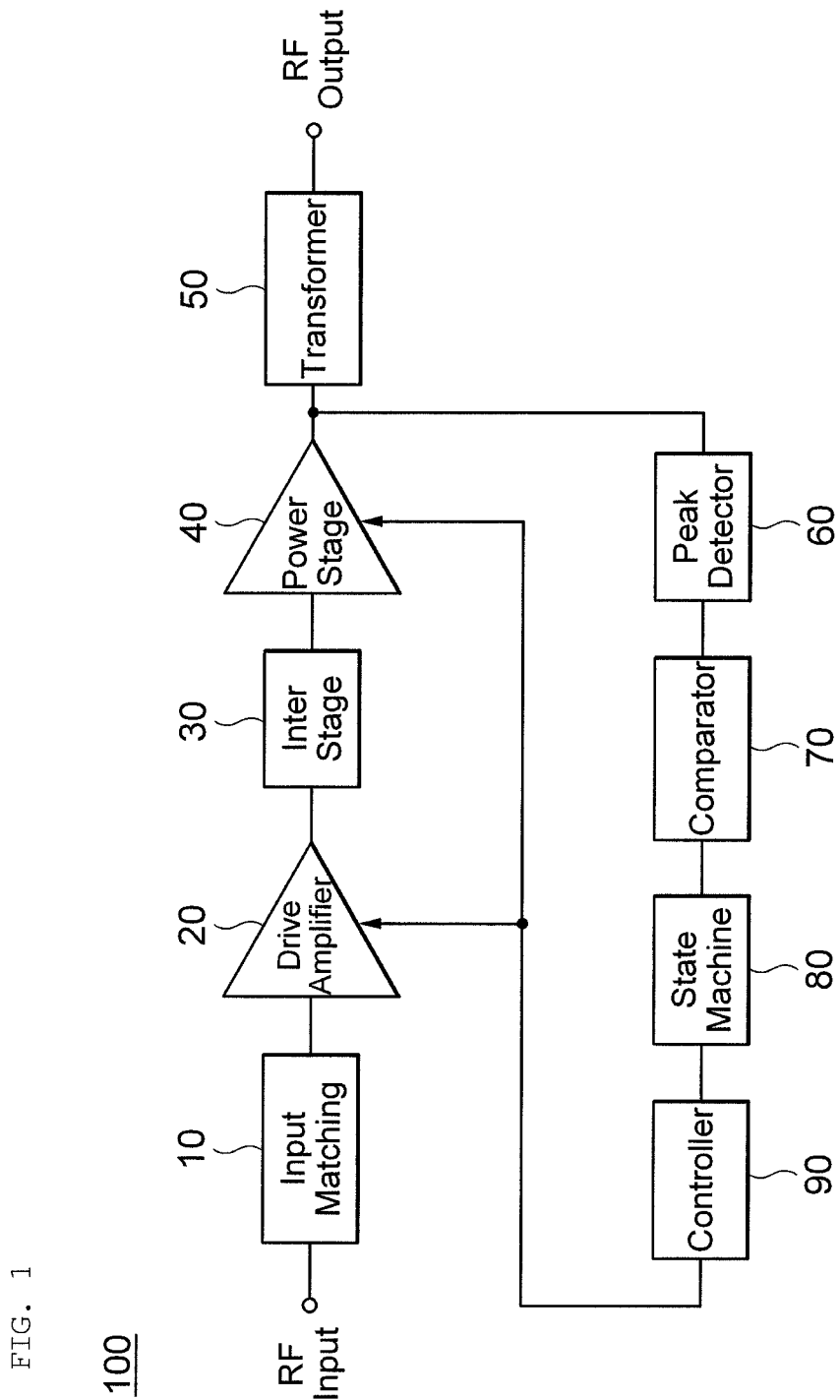
FIG. 1 is a block diagram of a power amplifier according to an embodiment of the present invention.
Figure 2:
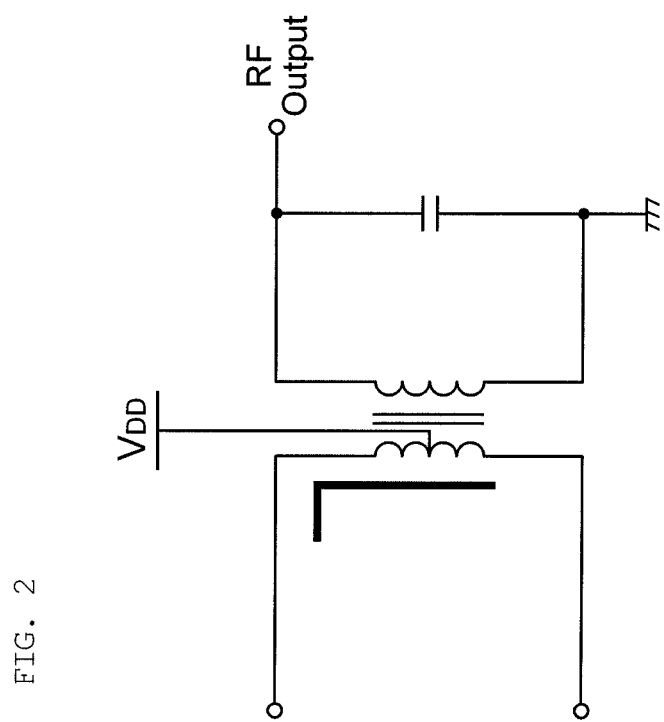
FIG. 2 is a circuit diagram of a transformer according to an embodiment of the present invention.

FIG. 1 is a block diagram of a power amplifier according to an embodiment of the present invention, and FIG. 2 is a circuit diagram of a transformer according to an embodiment of the present invention.

Referring to FIGS. 1 and 2, the power amplifier 100 according to an embodiment of the present invention may include a power stage 40 for amplifying a signal, a transformer 50 connected to an output terminal of the power stage 40 and coupling a signal output from the power stage 40, and a controller 90 controlling a bias voltage of the power stage 40 according to the coupled signal.

The power amplifier 100 may further include a signal input unit (not shown) for inputting a signal. In this case, the power stage 40 may amplify a signal output from the signal input unit (not shown), and the transformer 50 may couple a signal output from the power stage 40.

Meanwhile, the power stage 40 may be operated by a bias voltage input from the controller 90. In this case, the power stage 40 may be a complementary metal-oxide semiconductor (CMOS) or a bipolar junction transistor (BJT).

Also, the power amplifier 100 may further include a feedback unit (not shown) for feeding back the coupled signal, and the controller 90 may control the bias voltage from the power stage 40 according to the coupled signal.

Thus, in the power amplifier according to an embodiment of the present invention, although output impedance is changed, an excessive output cannot be generated, thus preventing damage to an element. Also, the circuit is simple and efficiency and accuracy can be enhanced, in comparison to the related art using a replica circuit.

Referring to FIG. 2, the transformer 50 may include an input terminal connected to the output terminal of the power stage 40 and an output terminal induction-coupled to the input terminal to provide an entire output. In this case, an input terminal signal of the transformer 50 is coupled to be fed back to the feedback unit (not shown). Namely, the feedback unit (not shown) may copy the input terminal signal of the transformer 50.

Meanwhile, a plurality of power stages 40 may be provided. In this case, characteristics of operations of the plurality of power stages may be determined by efficiency of the respective power stages. Also, the controller 90 may provide a bias voltage to the plurality of respective power stages.

In this case, a plurality of transformers, a plurality of feedback units, and a plurality of controllers may be provided to be connected to the plurality of respective power stages. Thus, the plurality of feedback units may couple input side signals of the plurality of transformers, respectively, to thereby provide bias voltages to the plurality of power stages through the plurality of controllers, respectively.

The power amplifier 100 may further include an input matching unit 10 for matching a signal, which has been input to the power amplifier 100, to the power amplifier 100, a drive amplifier 20 connected to the input matching unit 10 and operated by a bias voltage input from the controller 90, and an inter stage 30 for matching the power stage 40 and the drive amplifier 20.

The input matching unit 10 is used to match a balanced circuit and an unbalanced circuit. Namely, the input matching unit 10 may be used to match a signal, which has been input to the power amplifier 100, to the power amplifier 100. In this case, the input matching unit 10 may be a balanced-to-unbalanced (Balun) transformer.

The drive amplifier 20 may be connected to the input matching unit 10 and operated by a bias voltage input from the controller 90. An output terminal signal of the power stage 40 is required to have a high power level, and in this case, since it is difficult to satisfy both a high power level and a high gain, an extra amplifier having a high gain may be required to be driven. To this end, the drive amplifier 20 may be positioned in a front stage of the power stage 40 so as to be operated. In this case, the drive amplifier 20 may be a CMOS or a BJT.

The inter stage 30 is connected between the drive amplifier 20 and the power stage 40 and is able to make an output signal from the drive amplifier 20 be transferred with a maximum level of power to the power stage 40. In this case, the inter stage 30 may be implemented as a circuit by an R-L-C element.

Figure 3:
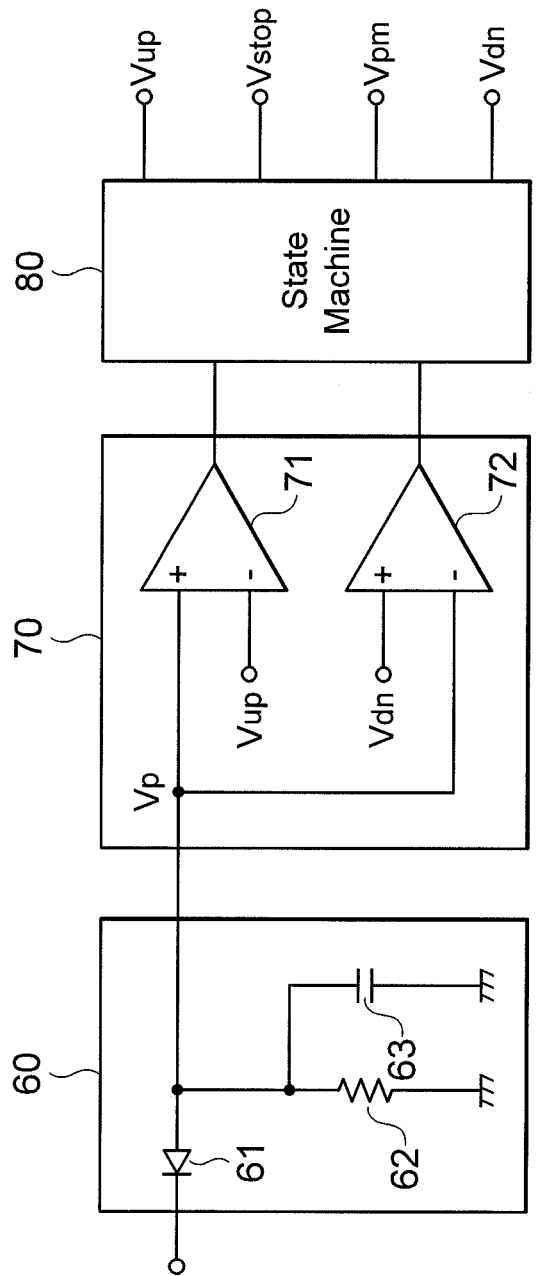
FIG. 3 is a block diagram of a feedback unit according to an embodiment of the present invention.
Figures 4, 5:
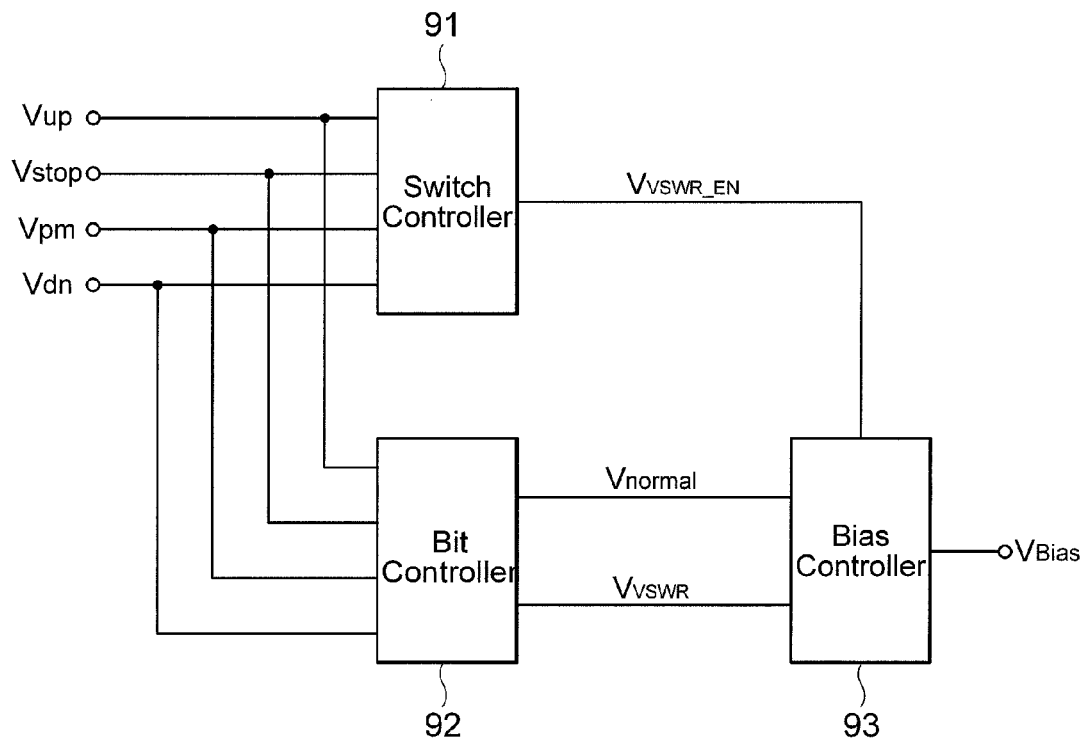
FIG. 4 is a block diagram of a controller according to an embodiment of the present invention.
FIG. 5 is a truth table of bias signals according to an embodiment of the present invention.

FIG. 3 is a block diagram of a feedback unit according to an embodiment of the present invention, FIG. 4 is a block diagram of a controller according to an embodiment of the present invention, and FIG. 5 is a truth table of bias signals according to an embodiment of the present invention.

Referring to FIG. 3, the feedback unit may include a peak detector 60 receiving a coupled signal from an input terminal of the transformer 50 and detecting strength of the coupled signal, a comparator 70 connected to the peak detector 60 and comparing a normal state signal and an abnormal state signal, and a state machine 80 connected to the comparator 70 and generating state signals in response to signals output from the comparator 70.

The peak detector 60 may receive a primary side signal from the coupled transformer 50 and detect strength of the primary side signal. Since the peak detector 60 receives the primary side signal as an input signal by coupling it, the peak detector 60 is able to detect accurate strength of the signal regardless of a change in output impedance. Namely, in comparison to the related art in which there may be a difference between a primary side signal and a secondary side signal of the transformer due to a change in output impedance, in an embodiment of the present invention, the peak detector 60 may detect accurate strength of the signal by reflecting a phase of the primary signal of the transformer 50.

Meanwhile, the peak detector 60 may include a rectifier 61 for rectifying the coupled signal from an AC voltage to a DC voltage. Also, the peak detector 60 may include an element in which a resistor 62 and a capacitor 63 are connected in parallel.

The comparator 70 may be connected to the peak detector 60 and receive an output signal from the peak detector 60. Thus, the comparator 70 may receive a rectified DC voltage from the rectifier 61, as an input signal, and compare a normal operational state and an abnormal operational state. In this case, the abnormal operational state may refer to a case in which an output from the power amplifier is excessive. The comparator 70 may include a first comparator 71 and a second comparator 72.

The state machine 80 may be connected to the comparator 70 and generate state signals in response to signals output from the comparator 70. In this case, the state signals may be four types of signals, i.e., $V_{up}$, $V_{dn}$, $V_{pm}$, and $V_{stop}$.

When a current state signal is $V_p$, if the magnitude of the current state signal $V_p$ is between $V_{up}$ and $V_{dn}$, the signal $V_{stop}$ output from the state machine 80 may have a high level. When the magnitude of the signal $V_p$ is greater than that of the signal $V_{up}$, the signal $V_{pm}$ output from the state machine 80 may have a high level, and when the magnitude of the signal $V_p$ is smaller than that of the signal $V_{dn}$, the signal $V_{pm}$ output from the state machine 80 may have a low level.

Referring to FIG. 5, when the signals $V_{up}$ and $V_{dn}$ have a low level or a high level, the signal $V_{pm}$ has a low level while the signal $V_{stop}$ has a high level, the bias voltage may be maintained in a current state. Namely, in this case, the bias voltage provided to the power stage 40 and the drive amplifier 20 may be maintained without being changed.

When the signal $V_{up}$ has a low level and the signal $V_{dn}$ has a high level, the signal $V_{pm}$ has a low level. Thus, the bias voltage may be provided in a state being higher than a current state. Namely, in this case, a higher bias voltage than a current state may be provided to the power stage 40 and the drive amplifier 20.

When the signal $V_{up}$ has a high level and the signal $V_{dn}$ has a low level, the signal $V_{pm}$ has a high level. Thus, the bias voltage may be provided in a state being lower than a current state. Namely, in this case, a lower bias voltage than a current state may be provided to the power stage 40 and the drive amplifier 20.

Referring to FIG. 4, the controller 90 may include a switch controller 91, a bit controller 92, and a bias controller 93.

The switch controller 91 may be connected to the state machine 80 and receive a signal output from the state machine 80, as an input signal, and provide an enable signal $V_{VSWR\_EN}$ to the bias controller 93.

The bit controller 92 may be connected to the state machine 80 and receive a signal output from the state machine 80, as an input signal, and provide a normal stage signal $V_{normal}$ and an abnormal state signal $V_{VSWR}$ to the bias controller 93.

The bias controller 93 may be connected to the switch controller 91 and the bit controller 92 and receive signals from the switch controller 91 and the bit controller 92, as input signals, and provide a bias voltage to the power stage 40 and the drive amplifier 20.

The bias controller 93 may be a multiplexer (MUX).

According to the exemplary embodiments of the present invention, although output impedance is changed, damage to the power amplifier can be prevented.

Also, the power amplifier can be automatically controlled to maintain performance thereof by sensing an operational state in which output impedance is normal.

Although the preferred embodiments of the present invention have been disclosed for illustrative purposes, those skilled in the art will appreciate that various modifications, additions and substitutions are possible, without departing from the scope and spirit of the invention as disclosed in the accompanying claims. Accordingly, such modifications, additions, and substitutions should also be understood to fall within the scope of the present invention.

What is claimed is:

1. A power amplifier comprising:
a power stage amplifying a signal;
a transformer connected to an output terminal of the power stage and coupling, in an input terminal, a signal output from the power stage; and
a controller controlling a bias voltage of the power stage according to the coupled signal,
wherein the transformer comprises:
an input terminal connected to an output terminal of the power stage, and
an output terminal induction-coupled to the input terminal and providing an entire output.

2. The power amplifier according to claim 1, wherein the power stage is operated by a bias voltage input from the controller.

3. The power amplifier according to claim 1, wherein a plurality of power stages are provided.

4. The power amplifier according to claim 3, wherein characteristics of operation of the plurality of power stages are determined by efficiency of respective power stages.

5. The power amplifier according to claim 4, wherein the controller provides a bias voltage to each of the plurality of power stages.

6. The power amplifier according to claim 1, further comprising:
an input matching unit matching a signal input to the power amplifier, to the power amplifier;
a drive amplifier connected to the input matching unit and operated by a bias voltage input from the controller; and
an inter stage matching the power stage and the drive amplifier.

7. The power amplifier according to claim 6, wherein the input matching unit is a balanced-to-unbalanced (Balun) transformer.

8. The power amplifier according to claim 7, wherein the power stage and the drive amplifier are a complementary metal-oxide semiconductor (CMOS) or a bipolar junction transistor (BJT).

9. The power amplifier according to claim 1, further comprising:
a peak detector receiving a coupled signal from an input terminal of the transformer and detecting strength of the coupled signal;
a comparator connected to the peak detector and comparing a normal state signal and an abnormal state signal; and
a state machine connected to the comparator and generating state signals in response to signals output from the comparator.

10. The power amplifier according to claim 9, wherein the peak detector includes a rectifier rectifying the coupled signal from an AC voltage to a DC voltage.

11. A power amplifier comprising:
a signal input unit;
a power stage amplifying a signal output from the signal input unit;
a transformer coupling, in an input terminal, a signal output from the power stage;
a feedback unit feeding back the coupled signal; and
a controller controlling a bias voltage of the power stage according to the coupled signal,
wherein the transformer comprises:
an input terminal connected to an output terminal of the power stage, and
an output terminal induction-coupled to the input terminal and providing an entire output.

12. The power amplifier according to claim 11, wherein a plurality of power stages are provided.

13. The power amplifier according to claim 12, wherein the controller provides a bias voltage to each of the plurality of power stages.

14. The power amplifier according to claim 11, wherein the signal input unit includes:
- an input matching unit matching a signal input to the power amplifier, to the power amplifier;
- a drive amplifier connected to the input matching unit and operated by a bias voltage input from the controller; and
- an inter stage matching the power stage and the drive amplifier.

15. The power amplifier according to claim 11, wherein the feedback unit includes:
- a peak detector receiving a coupled signal from an input terminal of the transformer and detecting strength of the coupled signal;
- a comparator connected to the peak detector and comparing a normal state signal and an abnormal state signal; and
- a state machine connected to the comparator and generating state signals in response to signals output from the comparator.

* * * * *